(12) United States Patent
Lin et al.

(10) Patent No.: US 12,500,180 B2
(45) Date of Patent: Dec. 16, 2025

(54) SEMICONDUCTOR PACKAGE WITH INTEGRATED ANTENNA AND SHIELDING PILLARS

(71) Applicant: MEDIATEK INC., Hsin-Chu (TW)

(72) Inventors: Tzu-Hung Lin, Hsinchu (TW);
Chih-Ming Hung, San Jose, CA (US);
Shih-Chia Chiu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 488 days.

(21) Appl. No.: 17/987,873

(22) Filed: Nov. 16, 2022

(65) Prior Publication Data

US 2023/0187377 A1     Jun. 15, 2023

Related U.S. Application Data

(60) Provisional application No. 63/289,252, filed on Dec. 14, 2021.

(51) Int. Cl.
*H01L 23/552*      (2006.01)
*H01L 23/00*       (2006.01)
(Continued)

(52) U.S. Cl.
CPC ...... *H01L 23/552* (2013.01); *H01L 23/49816* (2013.01); *H01L 23/49822* (2013.01);
(Continued)

(58) Field of Classification Search
CPC ............. H01L 23/552; H01L 23/49816; H01L 23/49822; H01L 23/49833; H01L 23/49838; H01L 23/66; H01L 24/16; H01L 25/0655; H01L 25/105; H01L 23/145; H01L 2223/6616; H01L 2223/6677; H01L 2224/1601; H01L 2224/16235; H01L 2225/1023; H01L 2225/1041; H01L 2225/107; H01L 2924/1421;
(Continued)

(56) References Cited

U.S. PATENT DOCUMENTS 10,777,518 B1    9/2020   Wang
2008/0285244 A1*   11/2008   Knickerbocker .... G01R 1/0425
                                                    361/760

(Continued)

FOREIGN PATENT DOCUMENTS

CN       108417563 A     8/2018
CN       113539844 A    10/2021
(Continued)

*Primary Examiner* — Theresa T Doan
(74) *Attorney, Agent, or Firm* — Winston Hsu

(57) ABSTRACT

A semiconductor package includes a base film, a semiconductor die on the base film, metal studs on the semiconductor die, shielding pillars on the base film and around the semiconductor die, a first molding compound encapsulating the semiconductor die, the metal studs, and the shielding pillars, a first re-distribution structure on the first molding compound, a second molding compound on the first re-distribution structure, through-mold-vias in the second molding compound, and a second re-distribution structure on the second molding compound and electrically connected to the through-mold-vias. The second re-distribution structure comprises an antenna.

34 Claims, 14 Drawing Sheets

(51) Int. Cl.
*H01L 23/498* (2006.01)
*H01L 23/66* (2006.01)
*H01L 25/065* (2023.01)
*H01L 25/10* (2006.01)
*H01Q 1/38* (2006.01)
*H01L 23/14* (2006.01)

(52) U.S. Cl.
CPC .. *H01L 23/49833* (2013.01); *H01L 23/49838* (2013.01); *H01L 23/66* (2013.01); *H01L 24/16* (2013.01); *H01L 25/0655* (2013.01); *H01L 25/105* (2013.01); *H01Q 1/38* (2013.01); *H01L 23/145* (2013.01); *H01L 2223/6616* (2013.01); *H01L 2223/6677* (2013.01); *H01L 2224/1601* (2013.01); *H01L 2224/16235* (2013.01); *H01L 2225/1023* (2013.01); *H01L 2225/1041* (2013.01); *H01L 2225/107* (2013.01); *H01L 2924/1421* (2013.01); *H01L 2924/1431* (2013.01); *H01L 2924/2027* (2013.01)

(58) Field of Classification Search
CPC ..... H01L 2924/1431; H01L 2924/2027; H01L 23/5389; H01L 25/0657; H01L 2221/6835; H01L 24/19; H01L 2224/04105; H01L 2224/16227; H01L 2224/214; H01L 2224/24227; H01L 2224/32225; H01L 2224/73267; H01L 2224/92244; H01L 2225/06541; H01L 2225/06548; H01L 2225/06572; H01L 2924/15311; H01L 2924/3025; H01L 23/4824; H01L 23/3128; H01L 23/3135; H01L 23/49; H01Q 1/38; H01Q 1/2283
USPC ......................................................... 257/659
See application file for complete search history.

(56) References Cited

U.S. PATENT DOCUMENTS

| | | |
|---|---|---|
| 2018/0247905 A1 | 8/2018 | Yu |
| 2019/0164892 A1 | 5/2019 | Franz |
| 2019/0189572 A1 | 6/2019 | Chiang |
| 2019/0333883 A1 | 10/2019 | Chiang |
| 2021/0159171 A1 | 5/2021 | Wang |
| 2021/0305140 A1 | 9/2021 | Hung |
| 2021/0313671 A1 | 10/2021 | Chuang |
| 2021/0375765 A1* | 12/2021 | Tseng .................. H01L 23/5386 |
| 2021/0391317 A1 | 12/2021 | Wu |

FOREIGN PATENT DOCUMENTS

| | | |
|---|---|---|
| DE | 10 2016 110 862 A1 | 12/2017 |
| TW | 201830649 A | 8/2018 |
| TW | 202011489 A | 3/2020 |
| TW | 202044504 A | 12/2020 |
| TW | 202107636 A | 2/2021 |
| TW | 202111913 A | 3/2021 |
| TW | 202127607 A | 7/2021 |

* cited by examiner

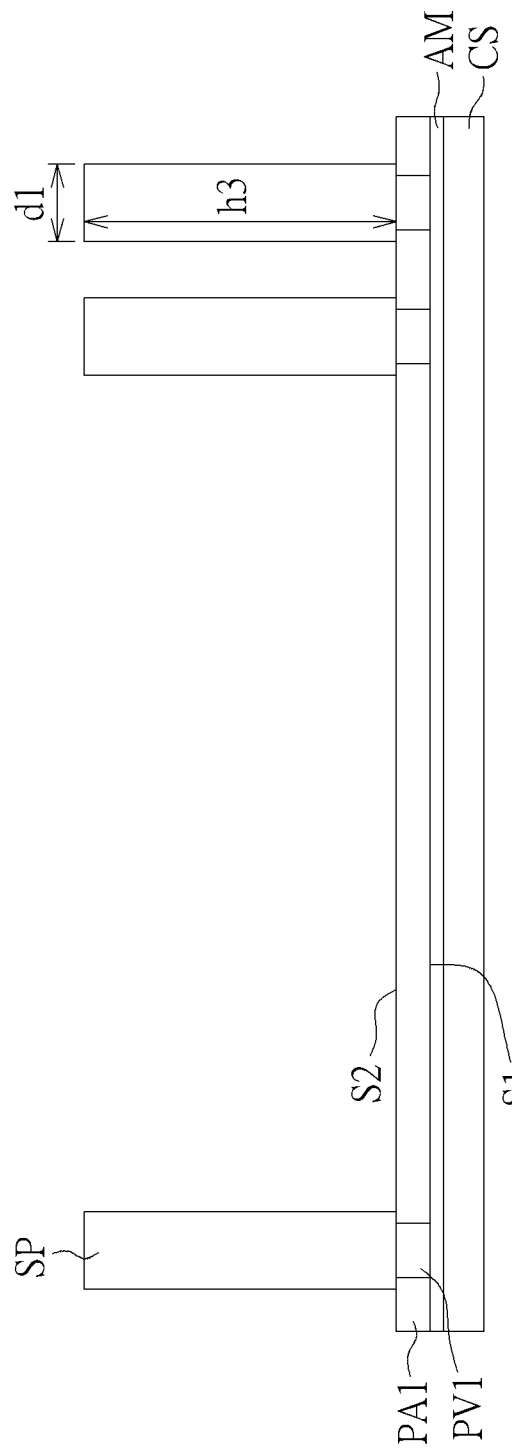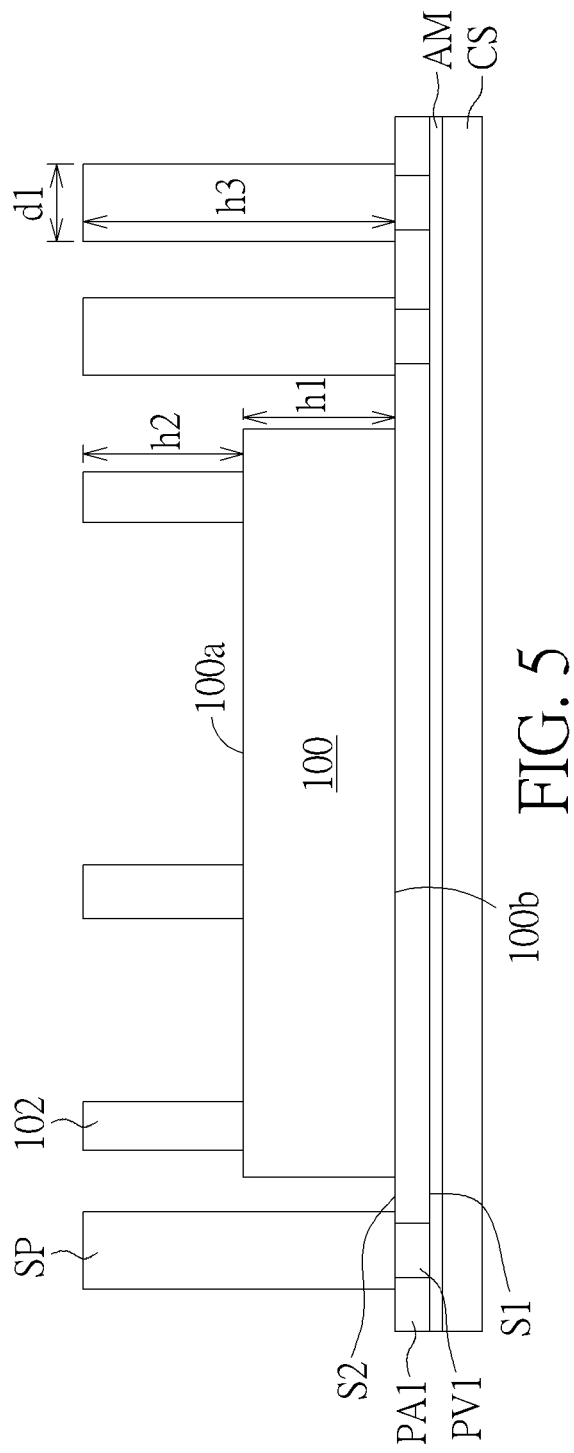

SEMICONDUCTOR PACKAGE WITH INTEGRATED ANTENNA AND SHIELDING PILLARS

CROSS REFERENCE TO RELATED APPLICATIONS

This application claims the benefit of U.S. Provisional Application No. 63/289,252, filed on Dec. 14, 2021. The content of the application is incorporated herein by reference.

BACKGROUND

The present disclosure relates generally to semiconductor packaging. More particularly, the present disclosure relates to an antenna-in-package (AiP) with integrated antenna and shielding pillars.

With the rising interest in millimeter wave (mmWave) wireless communication systems, such as fifth generation (5G) communication systems, automotive radar, and imaging systems, high gain and high radiation efficiency mmWave antennas have become very important. The mmWave is the frequency band from 30 to 300 GHz and corresponds to wavelengths from 10 mm to 1 mm. In the mmWave band, the antenna is small enough to be efficiently integrated in the package.

AiP technology is an antenna packaging solution that implements an antenna or antennas in an IC package that can carry a bare RF chip (transceiver). The AiP can be further integrated with front-end components (e.g., power amplifiers (PA) or low-noise amplifiers (LNA)), switches, filters and even power management integrated circuit (PMIC) to form an antenna module using System-in-Package (SiP) technologies.

A typical FCBGA AiP includes a RF chip (transceiver) attached to a package substrate with solder balls for connection to a main PCB. An array of antennas sits atop the upper portion of the package substrate, allowing wireless communication and detection. Flip-chip techniques are typically utilized to connect the RF chip to the substrate, thereby mitigating the interconnect loss.

When wireless communication packages with antennas are constructed, package designs need to provide good antenna properties (such as high efficiency, wide bandwidth, etc.) while providing reliable and low cost package solutions.

SUMMARY

One object of the present invention is to provide an improved semiconductor package with integrated antenna and shielding pillars in order to solve the above-mentioned prior art problems or shortcomings.

One aspect of the invention provides a semiconductor package including a base film having a major surface and a bottom surface opposite to the major surface. A semiconductor die is disposed on the major surface of the base film. A plurality of interconnect elements is disposed in the base film and around the semiconductor die. A plurality of metal studs is disposed on an active surface of the semiconductor die. A plurality of shielding pillars is disposed on the interconnect elements of the base film, respectively. A first molding compound encapsulates the semiconductor die, the metal studs, and the shielding pillars on the base film.

A first re-distribution structure is disposed on a top surface of the first molding compound and is electrically connected to the shielding pillars and the metal studs. The first re-distribution structure includes a via stack electrically connected to and aligned with a corresponding one of the plurality of metal studs. A second molding compound is disposed on the first re-distribution structure. A plurality of through-mold-vias is disposed in the second molding compound. The plurality of through-mold-vias includes an antenna feed line disposed directly on the via stack.

A second re-distribution structure is disposed on the second molding compound and electrically connected to the through-mold-vias. The second re-distribution structure includes an antenna that is electrically connected to the semiconductor die through the antenna feed line, the via stack, and the corresponding one of the plurality of metal studs. A plurality of connection elements is disposed on the interconnect elements, respectively, on the bottom surface of the base film.

According to some embodiments, the base film is a curable polymeric material film.

According to some embodiments, the base film has a thickness of about 5-7 micrometers after curing.

According to some embodiments, each of the plurality of interconnect elements is exposed from the bottom surface of the base film.

According to some embodiments, the plurality of interconnect elements comprises solder balls.

According to some embodiments, the semiconductor die comprises a RFIC die, a base chip, or a 5G wireless chip.

According to some embodiments, a rear surface of the semiconductor die is adhered to the base film.

According to some embodiments, the semiconductor die has a first height of about 40-60 micrometers above the major surface of the base film.

According to some embodiments, the plurality of metal studs has a second height of about 40-60 micrometers.

According to some embodiments, the plurality of shielding pillars has a third height of about 80-120 micrometers above the major surface of the base film.

According to some embodiments, the third height is approximately equal to combination of the first height and the second height.

According to some embodiments, each of the plurality of shielding pillars has a diameter of about 80 micrometers.

According to some embodiments, top surfaces of the plurality of metal studs and the plurality of shielding pillars are coplanar with the top surface of the first molding compound.

According to some embodiments, the first re-distribution structure comprises a plurality of dielectric films and a plurality of interconnect structures in or on the plurality of dielectric films.

According to some embodiments, the plurality of dielectric films comprises curable polymeric material films, and wherein the plurality of interconnect structures comprises conductive traces or conductive vias.

According to some embodiments, the plurality of interconnect structures further comprises a ground reflector.

According to some embodiments, each of the plurality of dielectric films has a thickness of about 5-7 micrometers after curing.

According to some embodiments, the via stack comprises a first via, a second via stacked on the first via, and a third via stacked on the second via, which are all substantially aligned with the corresponding one of the plurality of metal studs.

According to some embodiments, each of the through-mold-vias has a diameter greater than the diameter of each of the plurality of shielding pillars.

According to some embodiments, each of the through-mold-vias has a diameter of about 90 micrometers and a height of about 150-200 micrometers.

Another aspect of the invention provides a semiconductor package including a base film, a semiconductor die disposed on the base film, a plurality of metal studs disposed on an active surface of the semiconductor die, a plurality of shielding pillars disposed on the base film around the semiconductor die, a first molding compound encapsulating the semiconductor die, the metal studs, and the shielding pillars on the base film, a first re-distribution structure disposed on the first molding compound, a second molding compound disposed on the first re-distribution structure, a plurality of through-mold-vias disposed in the second molding compound, and a second re-distribution structure disposed on the second molding compound and electrically connected to the through-mold-vias.

According to some embodiments, the base film is a curable polymeric material film.

According to some embodiments, the base film has a thickness of about 5-7 micrometers after curing.

According to some embodiments, a plurality of interconnect elements is disposed in the base film and around the semiconductor die.

According to some embodiments, a plurality of connection elements disposed on the interconnect elements, respectively, on a bottom surface of the base film.

According to some embodiments, the plurality of shielding pillars is disposed on the interconnect elements of the base film, respectively.

According to some embodiments, the first re-distribution structure is electrically connected to the shielding pillars and the metal studs.

According to some embodiments, the first re-distribution structure comprises a via stack electrically connected to and aligned with a corresponding one of the plurality of metal studs.

According to some embodiments, the plurality of through-mold-vias comprises an antenna feed line disposed directly on the via stack.

According to some embodiments, the second re-distribution structure comprises an antenna that is electrically connected to the semiconductor die through the antenna feed line, the via stack, and the corresponding one of the plurality of metal studs.

According to some embodiments, each of the through-mold-vias has a diameter greater than the diameter of each of the plurality of shielding pillars.

According to some embodiments, each of the through-mold-vias has a diameter of about 90 micrometers and a height of about 150-200 micrometers.

According to some embodiments, a die is disposed in the second molding compound and on the first re-distribution structure.

According to some embodiments, the die comprises a dummy die, a bridge die, a TSV silicon die, or a flip-chip.

According to some embodiments, a die is disposed on the base film and is coplanar with the semiconductor die.

According to some embodiments, the die comprises a logic die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings:

FIG. 4 to FIG. 14 are schematic, cross-sectional diagrams showing an exemplary method for fabricating a semiconductor package with integrated antenna and shielding pillars in accordance with one embodiment of the invention;

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The present disclosure pertains to a substrate-less, dual-mold semiconductor package with integrated antenna and shielding pillars. A conventional BT substrate is spared, thereby reducing the dielectric loss and the product cost. The process flexibility is also improved by utilizing dual mold.

According to some embodiments, the semiconductor package may be a wafer-level D-band (110-1701 GHz) antenna-in-package (AiP) package and may integrate a radio-frequency integrated circuit (RFIC) and one or more than one flipped chips or dies in one package.

Figure 1:
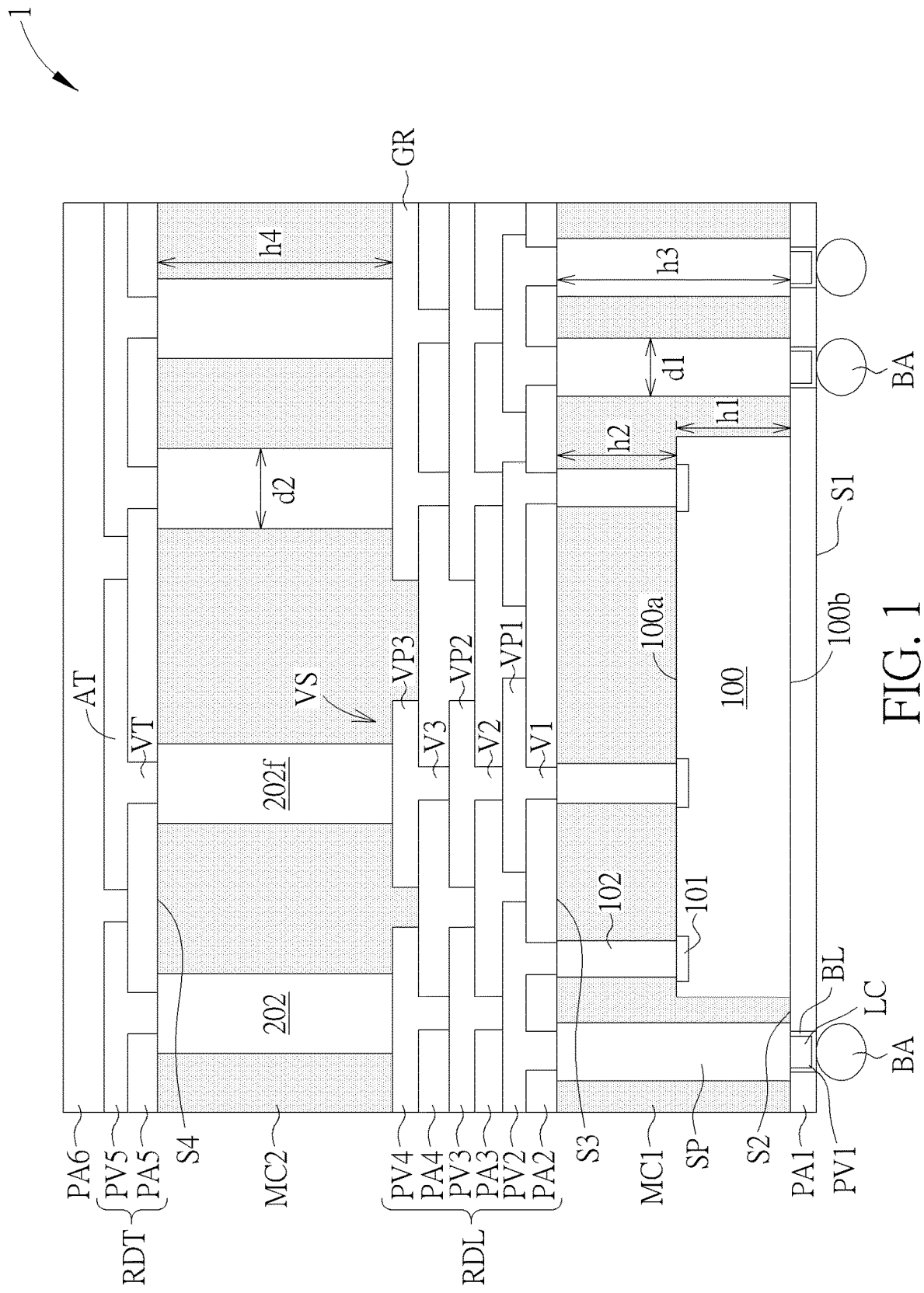
FIG. 1 is a schematic, cross-sectional diagram showing an exemplary semiconductor package with integrated antenna and shielding pillars in accordance with one embodiment of the invention.

Please refer to FIG. 1. FIG. 1 is a schematic, cross-sectional diagram showing an exemplary semiconductor package with integrated antenna and shielding pillars in accordance with one embodiment of the invention. As shown in FIG. 1, a semiconductor die 100 such as a RFIC die, a baseband chip, or a 5G wireless chip is disposed on a surface of a base film PA1 According to an embodiment, the base film PA1 may be a curable polymeric material film such as a polyimide film, but not limited thereto. According to an embodiment, for example, the base film PA1 may have a thickness of about 5-7 micrometers after curing.

According to an embodiment, interconnect elements PV1 such as via plugs are disposed in the base film PA1 around the semiconductor die 100. According to an embodiment, for example, each of the interconnect elements PV1 may have a barrier layer BL such as titanium or titanium nitride, and a low-resistance metal LC such as copper. The barrier layer BL of each of the interconnect elements PV1 may be exposed from a bottom surface S1 of the base film PAL According to an embodiment, connection elements BA such as solder balls may be disposed on the interconnect elements PV1, respectively, for further connection with an application board or a system board (not shown).

According to an embodiment, the semiconductor die 100 may have a thickness (or height) h1 of about 40-60 micrometers, for example, 50 micrometers, above a major surface S2 of the base film PAL According to an embodiment, the semiconductor die 100 has an active surface 100a and a passive, rear surface 100b opposite to the active surface 100a. According to an embodiment, the passive, rear surface 100b is adhered to the base film PAL According to an embodiment, a plurality of input/output (I/O) pads 101 may be disposed on the active surface 100a of the semiconductor die 100.

According to an embodiment, a plurality of metal studs 102 such as copper studs may be disposed on the plurality of I/O pads 101, respectively. According to an embodiment, the metal studs 102 may have a thickness (or height) h2 of about 40-60 micrometers, for example, 50 micrometers, above the active surface 100a of the semiconductor die 100.

According to an embodiment, shielding pillars SP such as copper pillars are disposed on the interconnect elements PV1 of the base film PA1, respectively. According to an embodiment, the shielding pillars SP may have a thickness (or height) h3 of about 80-120 micrometers, for example, 100 micrometers, above a major surface S2 of the base film PA1. According to an embodiment, for example, each of the shielding pillars SP may have a diameter d1 of about 80 micrometers. According to an embodiment, the height h3 may be approximately equal to the combination of the height h1 and the height h2. According to an embodiment, the semiconductor die 100, the metal studs 102, and the shielding pillars SP are encapsulated by a molding compound MC1. The molding compound MC1 is in direct contact with the sidewalls of the semiconductor die 100. According to an embodiment, the top surfaces of the metal studs 102 and the shielding pillars SP are coplanar with a top surface S3 of the molding compound MC1.

According to an embodiment, a re-distribution structure RDL is disposed on the top surface S3 of the molding compound MC1 and is electrically connected to the shielding pillars SP and the metal studs 102. According to an embodiment, for example, the re-distribution structure RDL may comprise dielectric films PA2-PA4 and interconnect structures PV2-PV4 fabricated in or on the dielectric films PA2-PA4, respectively. According to an embodiment, the re-distribution structure RDL may comprise via stacks VS. Each of the via stacks VS may be composed of a first via V1, a second via V2 stacked on the first via V1, and a third via V3 stacked on the second via V2, which are all substantially aligned with the corresponding metal stud 102. According to an embodiment, the first via V1 comprises a first flange portion VP1 on the dielectric film PA2, the second via V2 comprises a second flange portion VP2 on the dielectric film PA3, and the third via V3 comprises a third flange portion VP3 on the dielectric film PA4.

According to an embodiment, for example, the dielectric films PA2-PA4 may be curable polymeric material films such as polyimide films, but not limited thereto. According to an embodiment, for example, the interconnect structures PV2-PV4 may comprise conductive traces or conductive vias. According to an embodiment, for example, the interconnect structure PV4 may comprise a ground reflector GR. According to an embodiment, for example, the dielectric film PA2 may have a thickness of about 5-7 micrometers after curing. According to an embodiment, for example, the dielectric film PA3 may have a thickness of about 5-7 micrometers after curing. According to an embodiment, for example, the dielectric film PA4 may have a thickness of about 5-7 micrometers after curing.

According to an embodiment, the re-distribution structure RDL is encapsulated by a molding compound MC2. For example, the molding compound MC2 may have a thickness of about 150-200 micrometers. A plurality of through-mold-vias (TMVs) 202 is disposed in the molding compound MC2. The TMVs 202 may comprise an antenna feed line 202f disposed directly on the via stack VS. According to an embodiment, each of the TMVs 202 may have a diameter d2 greater than the diameter d1 of each of the shielding pillars SP. According to an embodiment, for example, each of the TMVs 202 may have a diameter d2 of about 90 micrometers and a height h4 of about 150-200 micrometers. According to an embodiment, the top surfaces of the TMVs 202 are coplanar with the top surface S4 of the molding compound MC2.

According to an embodiment, a re-distribution structure RDT is disposed on the top surface S4 of the molding compound MC2 and is electrically connected to the TMVs 202. According to an embodiment, for example, the re-distribution structure RDT may comprise a dielectric film PA5 and an interconnect structure PV5 fabricated in or on the dielectric film PA5. According to an embodiment, the re-distribution structure RDT may comprise an antenna AT on the dielectric film PA5. The antenna AT may be electrically connected to the underlying semiconductor die 100 through a via VT, the antenna feed line 202f, the via stack VS and the metal stud 102, which can provide better control for antenna radiation pattern and gain. The distance between the ground reflector GR and the antenna AT may be adjusted by controlling the thickness of the molding compound MC2.

According to an embodiment, for example, the dielectric film PA5 may be curable polymeric material films such as polyimide films, but not limited thereto. According to an embodiment, for example, the interconnect structure PV5 may comprise conductive traces or conductive vias. According to an embodiment, for example, the dielectric film PA5 may have a thickness of about 5-7 micrometers after curing. A passivation film PA6 may be disposed on the re-distribution structure RDT. The passivation film PA6 may be curable polymeric material films such as polyimide films, but not limited thereto. According to an embodiment, for example, the passivation film PA6 may have a thickness of about 5-7 micrometers after curing.

Figure 2:
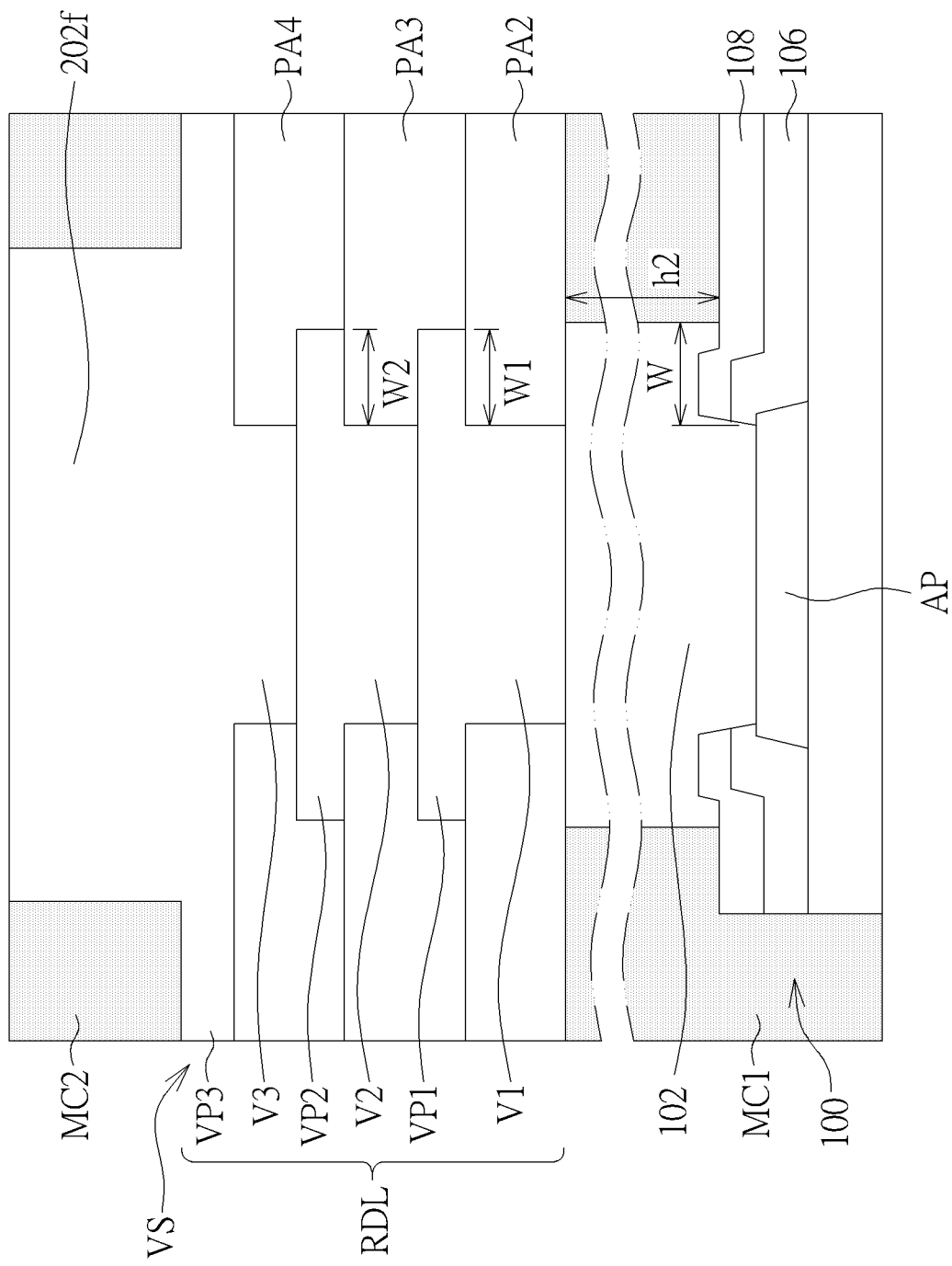
FIG. 2 is an enlarged view showing an exemplary structure of the via stack in the re-distribution structure of FIG. 1 in accordance with an embodiment of the invention.

FIG. 2 is an enlarged view showing an exemplary structure of the via stack VS in the re-distribution structure RDL of FIG. 1 in accordance with an embodiment of the invention, wherein like regions, layers or elements are designated by like numeral numbers or labels. As shown in FIG. 2, the metal stud 102 is landed on an aluminum pad AP of the semiconductor die 100. The perimeter of the aluminum pad AP may be covered by a passivation layer 106 such as a silicon nitride layer and a passivation layer 108 such as a polyimide layer. An opening OP, which has a diameter of about 31 micrometers, for example, is formed in the passivation layer 106 and the passivation layer 108 to expose a central portion of the aluminum pad AP. The metal stud 102 is formed in the opening OP and on the passivation layer 108 around the opening OP. For example, the width W of the extended portion of the metal stud 102 directly on the passivation layer 108 is about 3 micrometers. The height h2 of the metal stud 102 may be, for example, 50 micrometers.

According to an embodiment, the via stack VS is composed of a first via V1, a second via V2 stacked on the first via V1, and a third via V3 stacked on the second via V2, which are all substantially aligned with the metal stud 102. According to an embodiment, for example, the first via V1, the second via V2, and the third via V3 may have a diameter of about 31 micrometers, which is equal to the diameter of the opening OP. According to an embodiment, the first via V1 comprises a first flange portion VP1 on the dielectric film PA2, the second via V2 comprises a second flange portion VP2 on the dielectric film PA3, and the third via V3 comprises a third flange portion VP3 on the dielectric film PA4. According to an embodiment, for example, the first flange portion VP1 may have a width W1 of about 3 micrometers. According to an embodiment, for example, the second flange portion VP2 may have a width W2 of about 3 micrometers.

Figure 3:
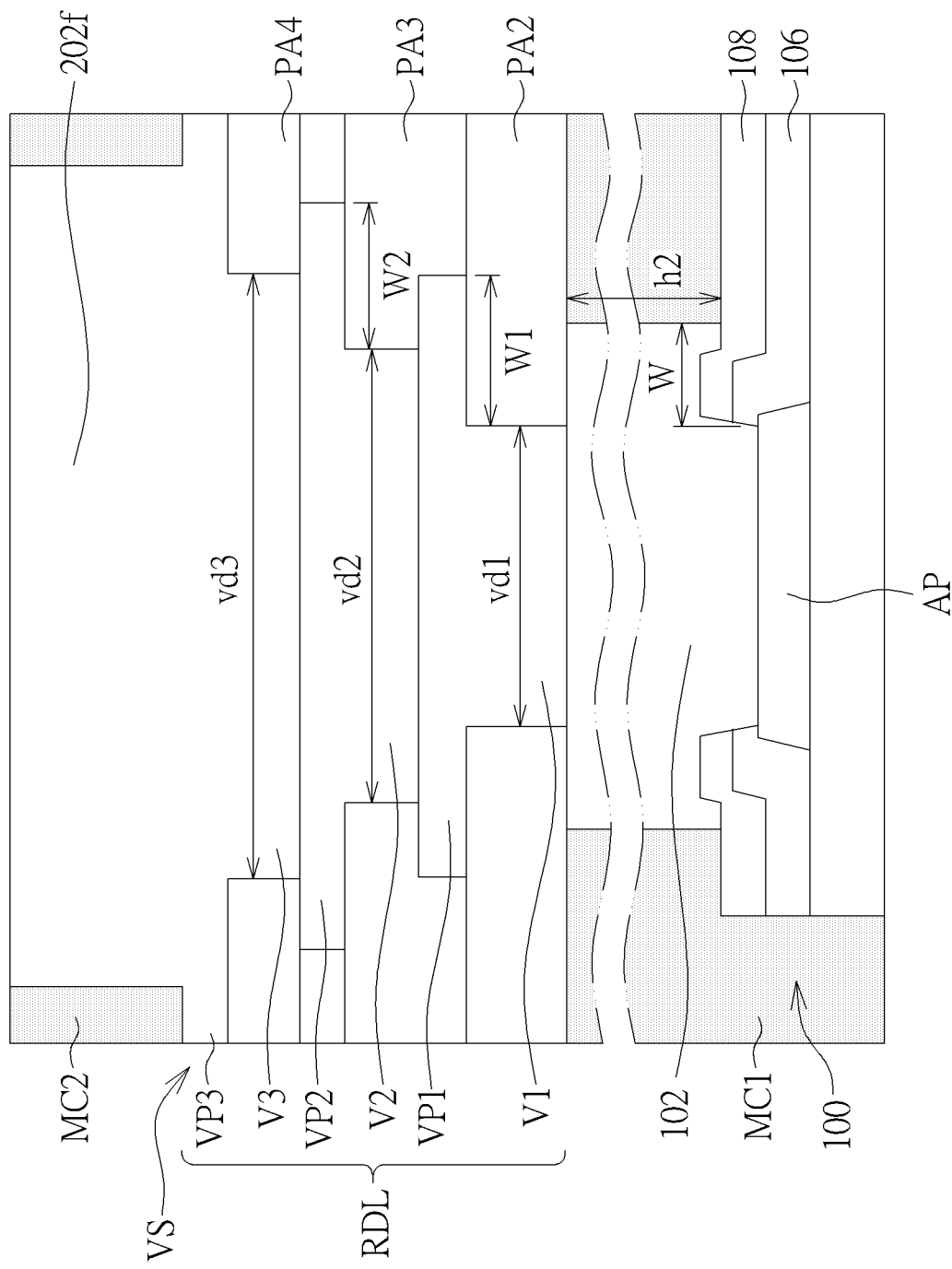
FIG. 3 is an enlarged view showing an exemplary structure of the via stack in the re-distribution structure of FIG. 1 in accordance with another embodiment of the invention.

FIG. 3 is an enlarged view showing an exemplary structure of the via stack VS in the re-distribution structure RDL of FIG. 1 in accordance with another embodiment of the invention, wherein like regions, layers or elements are designated by like numeral numbers or labels. As shown in FIG. 3, likewise, the metal stud 102 is landed on an aluminum pad AP of the semiconductor die 100. The perimeter of the aluminum pad AP may be covered by a passivation layer 106 and a passivation layer 108 such as a silicon nitride layer. An opening OP, which has a diameter of about 31 micrometers, for example, is formed in the passivation layer 106 and the passivation layer 108 to expose a central portion of the aluminum pad AP. The metal stud 102 is formed in the opening OP and on the passivation layer 108 around the opening OP. For example, the width W of the extended portion of the metal stud 102 directly on the passivation layer 108 is about 3 micrometers. The height h2 of the metal stud 102 may be, for example, 50 micrometers.

According to an embodiment, the via stack VS is composed of a first via V1, a second via V2 stacked on the first via V1, and a third via V3 stacked on the second via V2, which are all substantially aligned with the metal stud 102. According to an embodiment, for example, the first via V1 may have a diameter vd1 of about 31 micrometers, which is equal to the diameter of the opening OP. The second via V2 may have a diameter vd2 of about 41 micrometers, which is greater than the diameter of the opening OP. The third via V3 may have a diameter vd3 of about 51 micrometers, which is greater than the diameter of the second via V2. According to an embodiment, likewise, the first via V1 comprises a first flange portion VP1 on the dielectric film PA2, the second via V2 comprises a second flange portion VP2 on the dielectric film PA3, and the third via V3 comprises a third flange portion VP3 on the dielectric film PA4. According to an embodiment, for example, the first flange portion VP1 may have a width W1 of about 8 micrometers. According to an embodiment, for example, the second flange portion VP2 may have a width W2 of about 8 micrometers. When viewed from the above, the metal stud 102 is completely overlapped with the first via V1, and the first via V1 is completely overlapped with the second via V2.

FIG. 4 to FIG. 14 are schematic, cross-sectional diagrams showing an exemplary method for fabricating a semiconductor package with integrated antenna and shielding pillars in accordance with one embodiment of the invention, wherein like regions, layers or elements are designated by like numeral numbers or labels. It is to be understood that the process steps may be implemented in a wafer-level or panel-level manner.

As shown in FIG. 4, a carrier substrate CS having thereon an alignment mark layer AM is provided. A base film PA1 is laminated on the carrier substrate CS. According to an embodiment, the base film PA1 may be a curable polymeric material film such as a polyimide film, but not limited thereto. According to an embodiment, for example, the base film PA1 may have a thickness of about 5-7 micrometers after curing.

Subsequently, interconnect elements PV1 such as via plugs are formed in the base film PA1 and shielding pillars SP such as copper pillars are formed on the interconnect elements PV1, respectively. According to an embodiment, the shielding pillars SP may have a thickness (or height) h3 of about 80-120 micrometers, for example, 100 micrometers, above a major surface S2 of the base film PM. According to an embodiment, for example, each of the shielding pillars SP may have a diameter d1 of about 80 micrometers.

As shown in FIG. 5, a semiconductor die 100 such as a RFIC die, a base chip, or a 5G wireless chip is then disposed on the major surface S2 of the base film PM. According to an embodiment, the semiconductor die 100 may have a thickness (or height) h1 of about 40-60 micrometers, for example, 50 micrometers, above the major surface S2 of the base film PM. According to an embodiment, the semiconductor die 100 has an active surface 100a and a passive, rear surface 100b opposite to the active surface 100a. According to an embodiment, the passive, rear surface 100b is adhered to the base film PA1.

According to an embodiment, a plurality of metal studs 102 such as copper studs may be disposed on the active surface 100a of the semiconductor die 100. According to an embodiment, the metal studs 102 may have a thickness (or height) h2 of about 40-60 micrometers, for example, 50 micrometers, above the active surface 100a of the semiconductor die 100.

Figure 6:
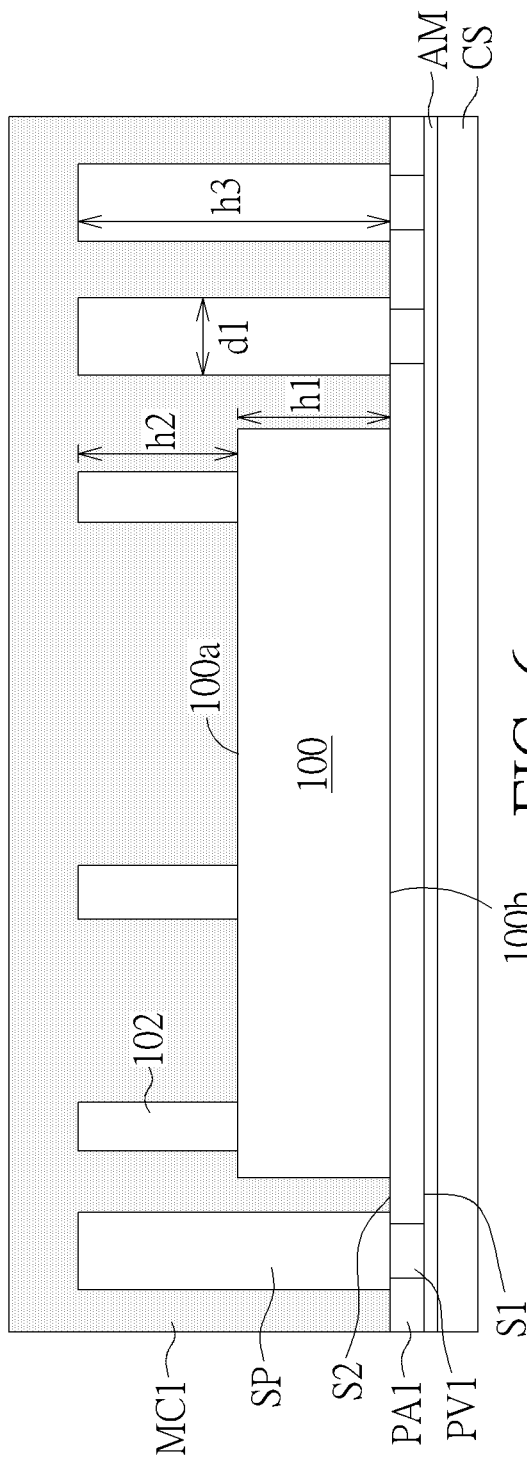

As shown in FIG. 6, subsequently, the semiconductor die 100, the metal studs 102, and the shielding pillars SP are encapsulated by a molding compound MC1. The molding compound MC1 is in direct contact with the sidewalls of the semiconductor die 100 and the exposed major surface S2 of the base film PA1.

Figure 7:
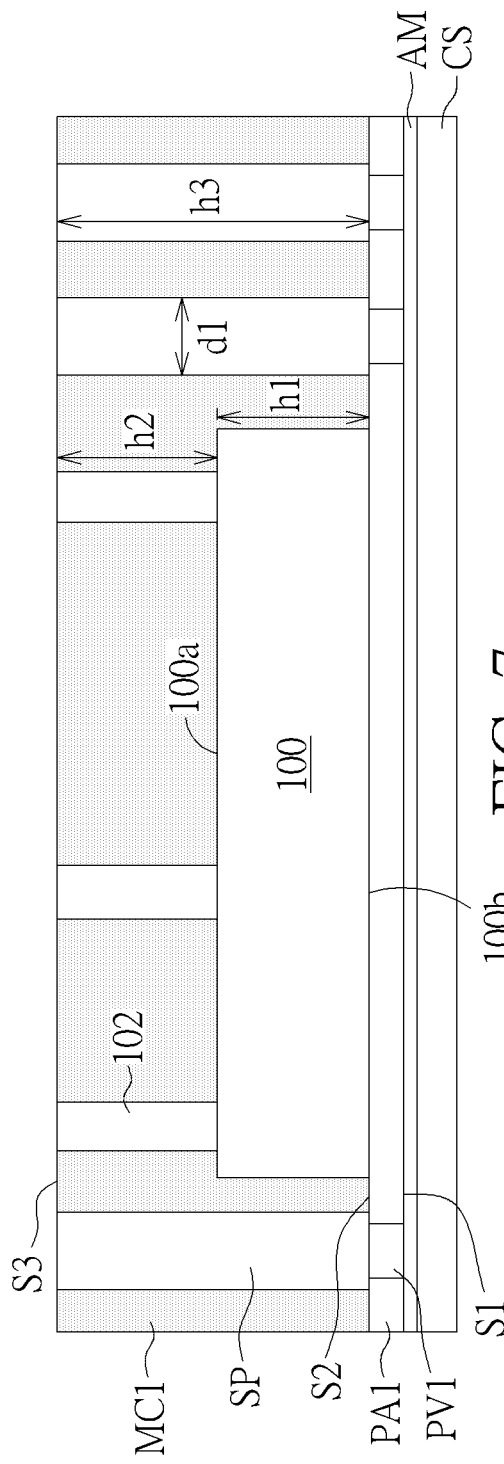

As shown in FIG. 7, a grinding process or a chemical mechanical polishing (CMP) process is then performed to polish the molding compound MC1. After the CMP process, the top surfaces of the metal studs 102 and the shielding pillars SP are coplanar with a top surface S3 of the molding compound MC1.

Figure 8:
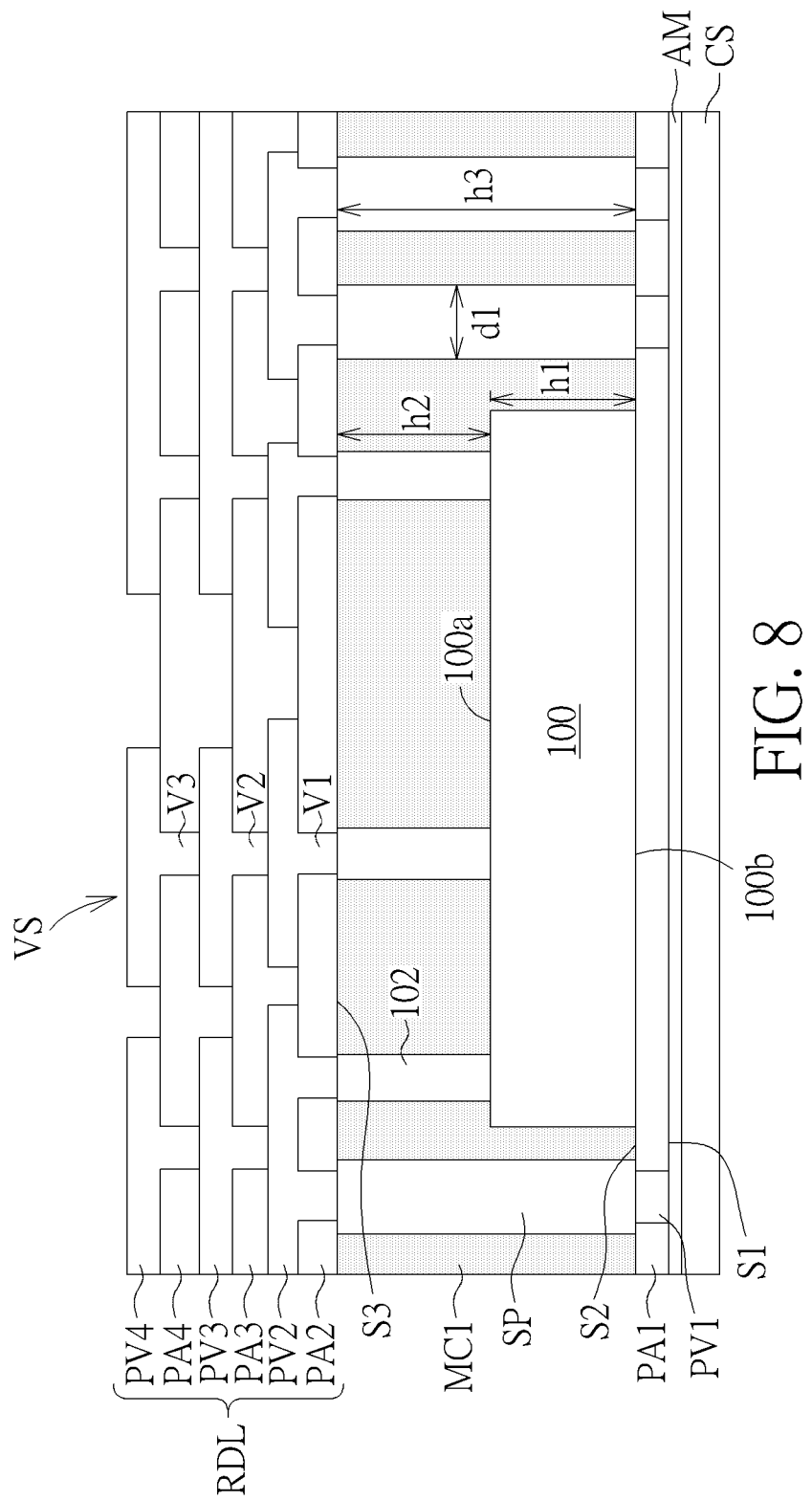

As shown in FIG. 8, a re-distribution structure RDL is disposed on the top surface S3 of the molding compound MC1 and is electrically connected to the shielding pillars SP and the metal studs 102. According to an embodiment, for example, the re-distribution structure RDL may comprise dielectric films PA2-PA4 and interconnect structures PV2-PV4 fabricated in or on the dielectric films PA2-PA4, respectively. According to an embodiment, the re-distribution structure RDL may comprise via stacks VS. Each of the via stacks VS may be composed of a first via V1, a second via V2 stacked on the first via V1, and a third via V3 stacked on the second via V2, which are all substantially aligned with the corresponding metal stud 102. The detailed structure of the via stack VS is illustrated in FIG. 2 and FIG. 3.

According to an embodiment, for example, the dielectric films PA2-PA4 may be curable polymeric material films such as polyimide films, but not limited thereto. According to an embodiment, for example, the interconnect structures PV2-PV4 may comprise conductive traces or conductive vias. According to an embodiment, for example, the dielectric film PA2 may have a thickness of about 5-7 micrometers after curing. According to an embodiment, for example, the dielectric film PA3 may have a thickness of about 5-7 micrometers after curing. According to an embodiment, for example, the dielectric film PA4 may have a thickness of about 5-7 micrometers after curing.

Figure 9:
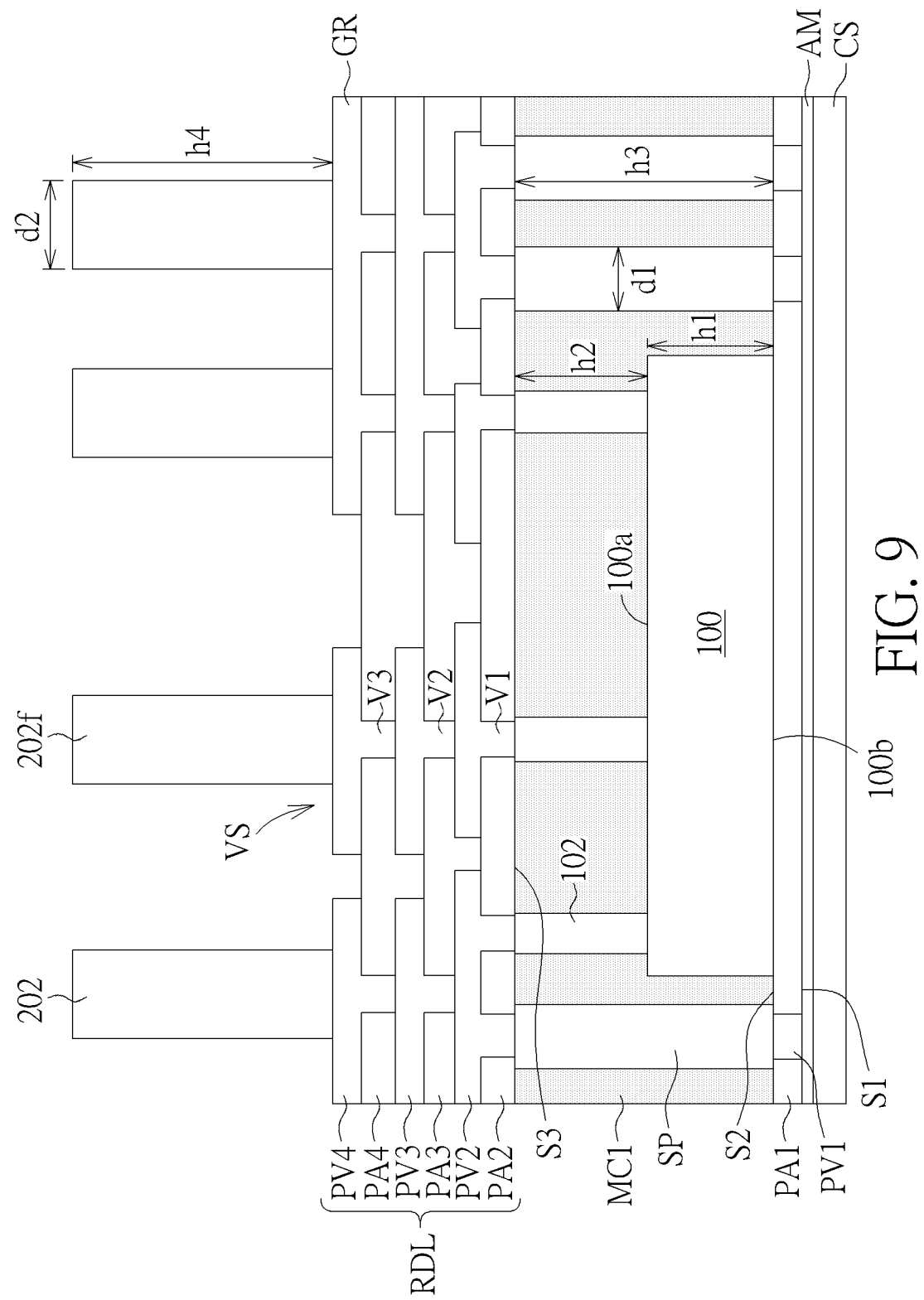

As shown in FIG. 9, through-mold-vias (TMVs) 202 are formed on the re-distribution structure RDL. The TMVs 202 may comprise an antenna feed line 202f disposed directly on the via stack VS. According to an embodiment, each of the TMVs 202 may have a diameter d2 greater than the diameter d1 of each of the shielding pillars SP. According to an embodiment, for example, each of the TMVs 202 may have a diameter d2 of about 90 micrometers and a height h4 of about 150-200 micrometers.

Figure 10:
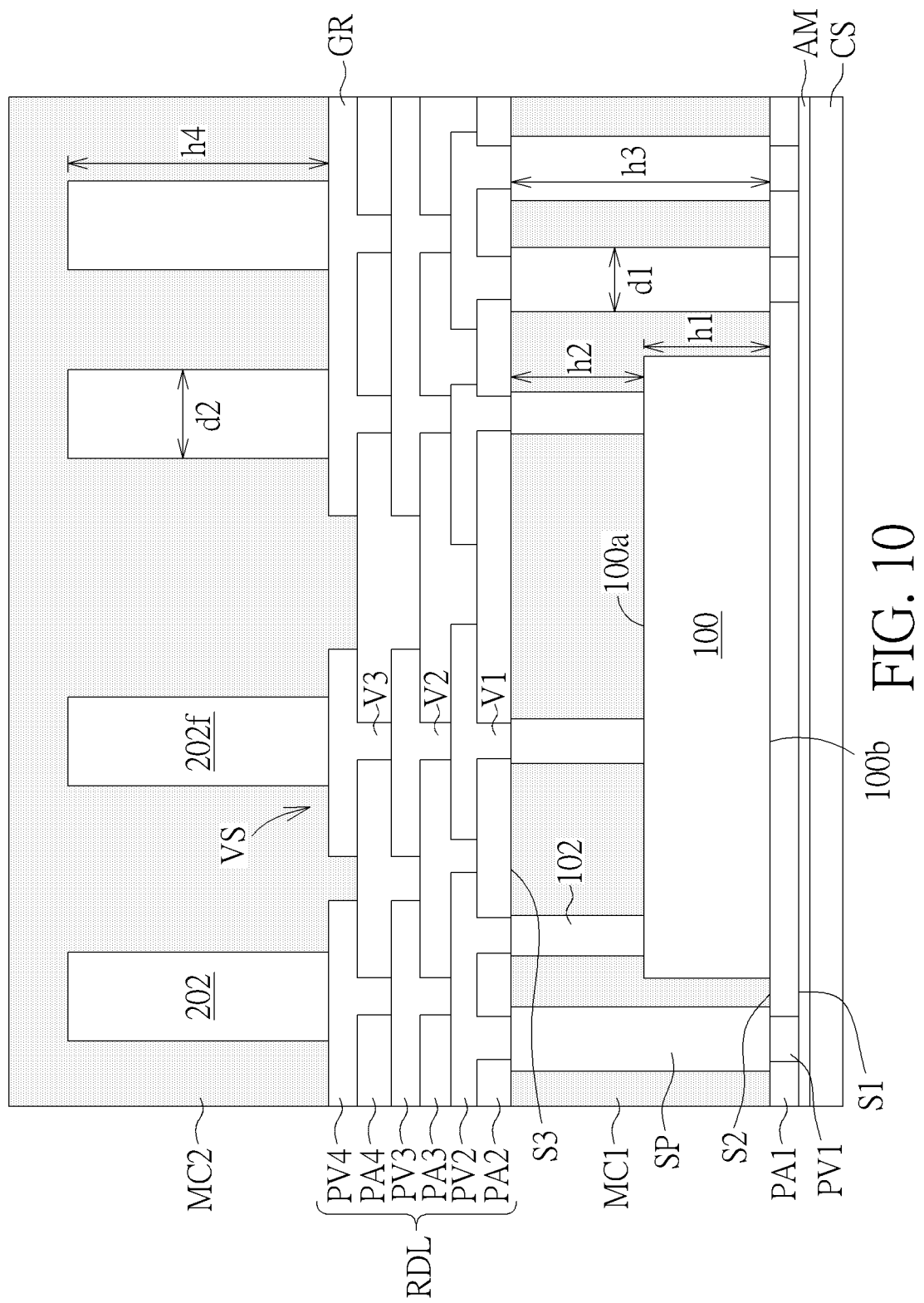

As shown in FIG. 10, subsequently, the TMVs 202 and the re-distribution structure RDL are encapsulated by a molding compound MC2. According to an embodiment, for example, the composition of the molding compound MC2 and the composition of the molding compound MC1 are the same. According to another embodiment, for example, the composition of the molding compound MC2 may be different from the composition of the molding compound MC1.

Figure 11:
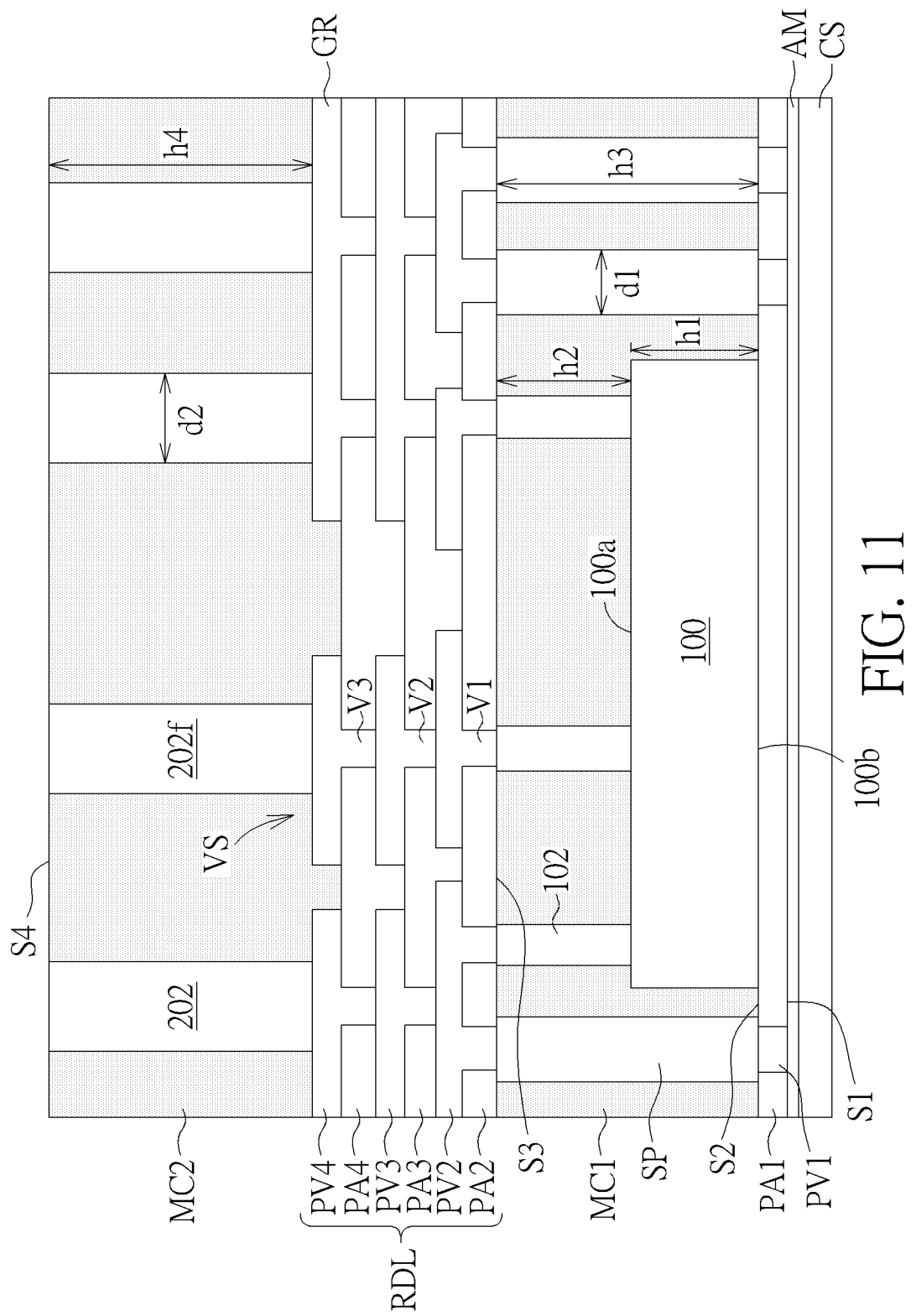

As shown in FIG. 11, a grinding process or a CMP process is then performed to polish the molding compound MC2. After the CMP process, the top surfaces of the TMVs 202 are coplanar with a top surface S4 of the molding compound MC2.

Figure 12:
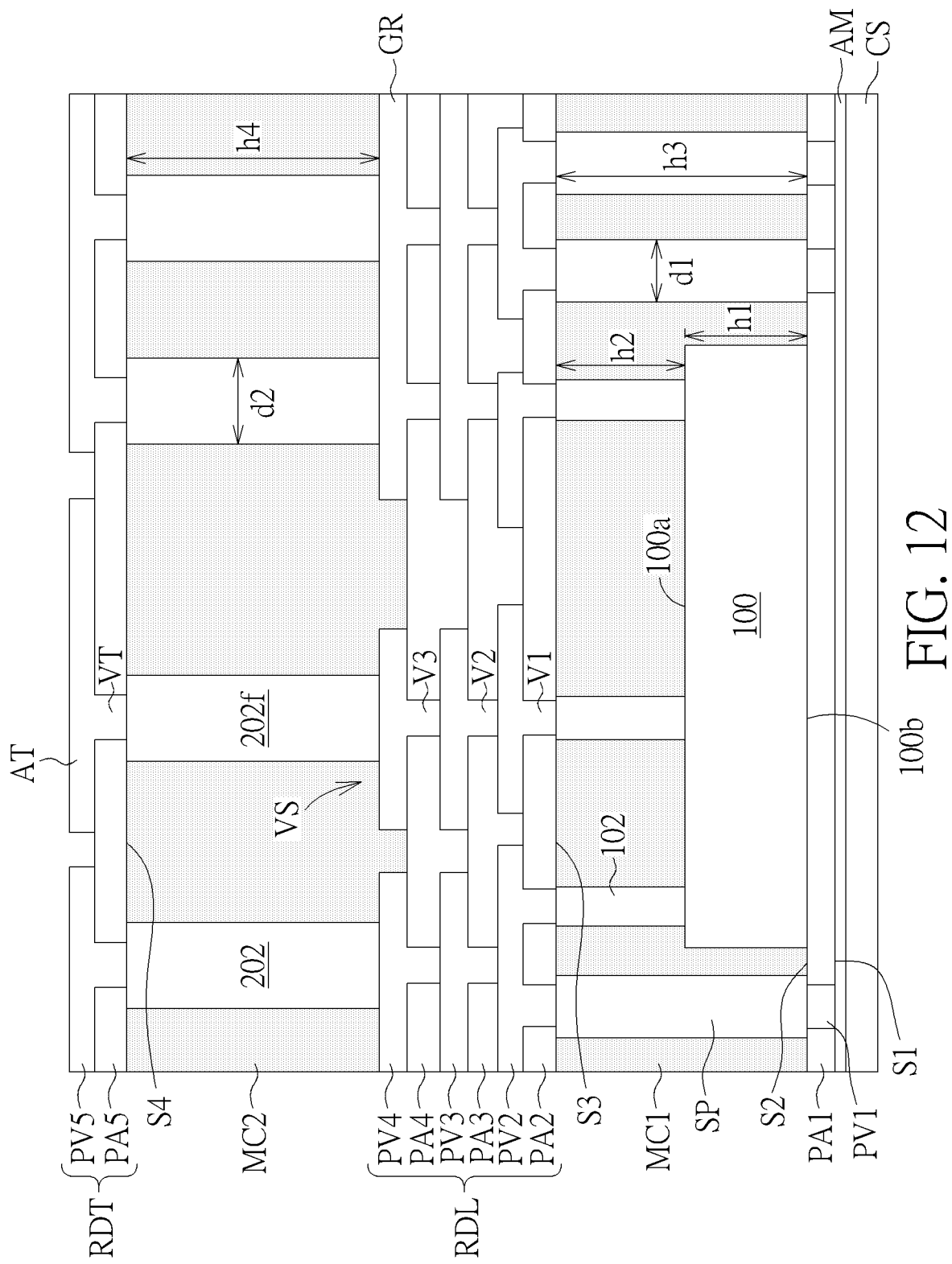

As shown in FIG. 12, a re-distribution structure RDT is then formed on the top surface S4 of the molding compound MC2 and is electrically connected to the TMVs 202. According to an embodiment, for example, the re-distribution structure RDT may comprise a dielectric film PAS and an interconnect structure PV5 fabricated in or on the dielectric film PAS. According to an embodiment, the re-distribution structure RDT may comprise an antenna AT on the dielectric film PAS. The antenna AT may be electrically connected to the underlying semiconductor die 100 through a via VT, the antenna feed line 202f, the via stack VS and the metal stud 102, which can provide better control for antenna radiation pattern and gain.

Figure 13:
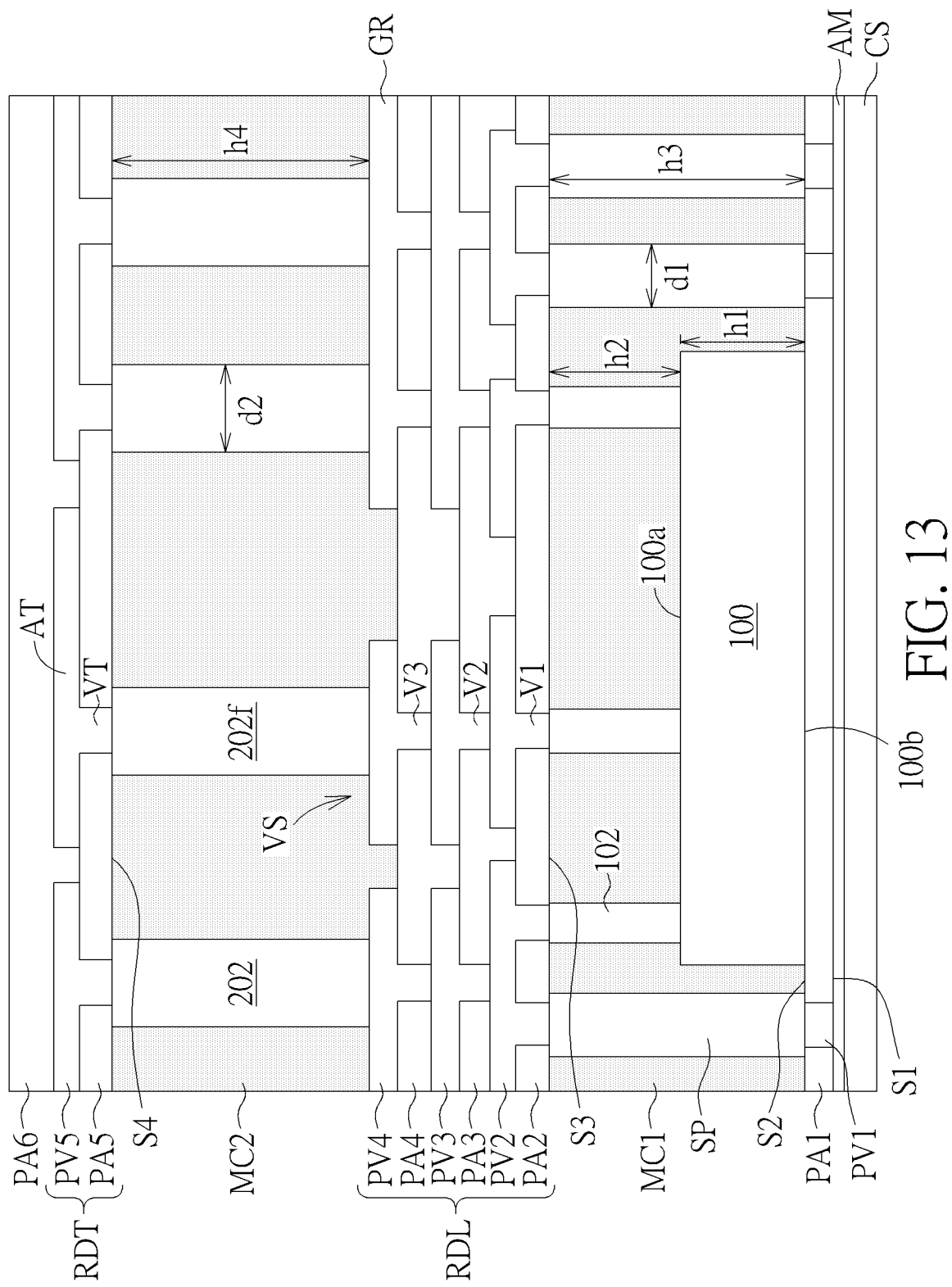

As shown in FIG. 13, a passivation film PA6 is then formed on the re-distribution structure RDT. According to an embodiment, the passivation film PA6 may be curable polymeric material films such as polyimide films, but not limited thereto. According to an embodiment, for example, the passivation film PA6 may have a thickness of about 5-7 micrometers after curing.

Figure 14:
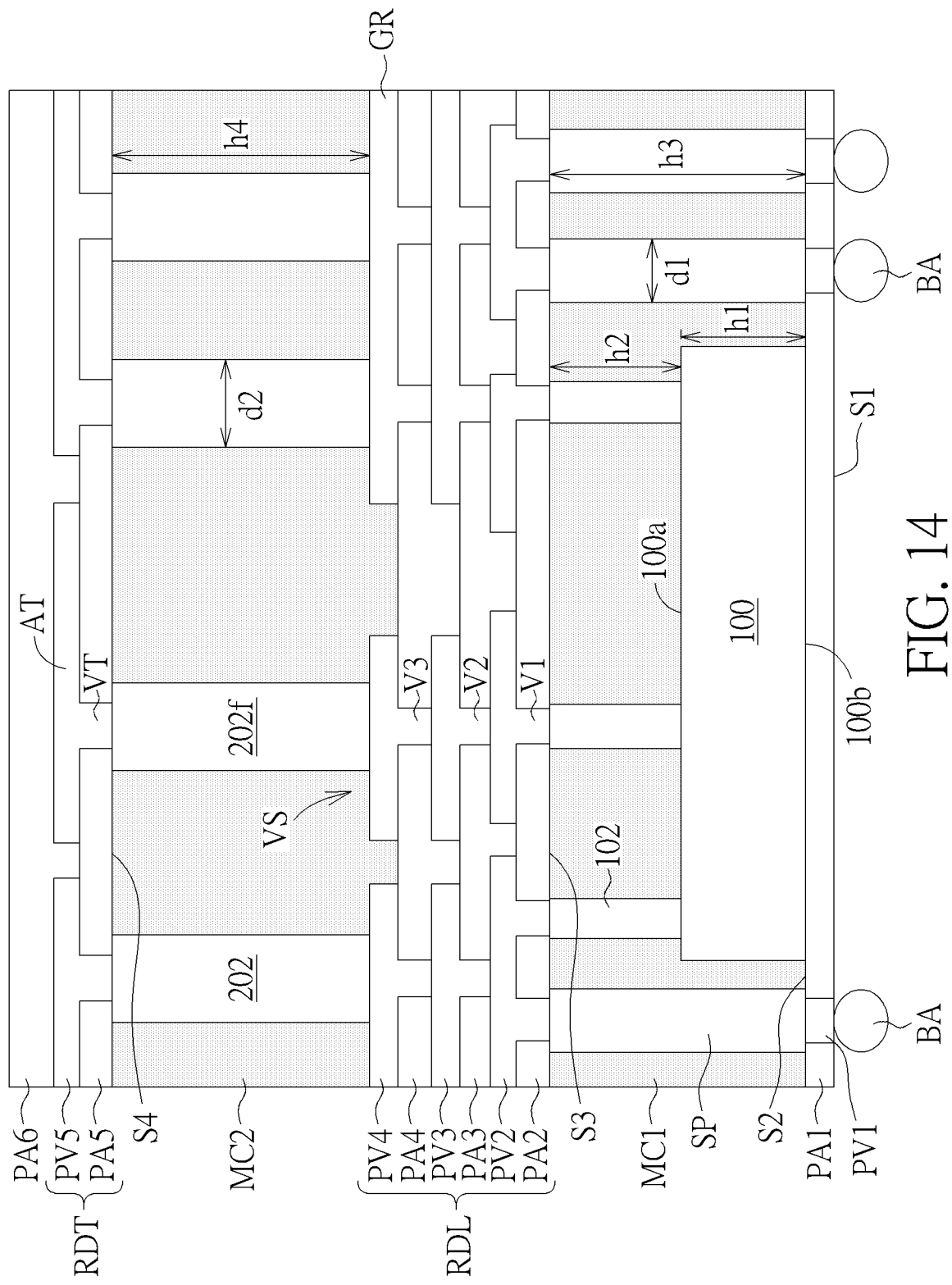

As shown in FIG. 14, after the formation of the passivation film PA6, the carrier substrate CS is removed. According to an embodiment, connection elements BA such as solder balls are formed on the interconnect elements PV1, respectively, for further connection with an application board or a system board (not shown).

Figure 15:
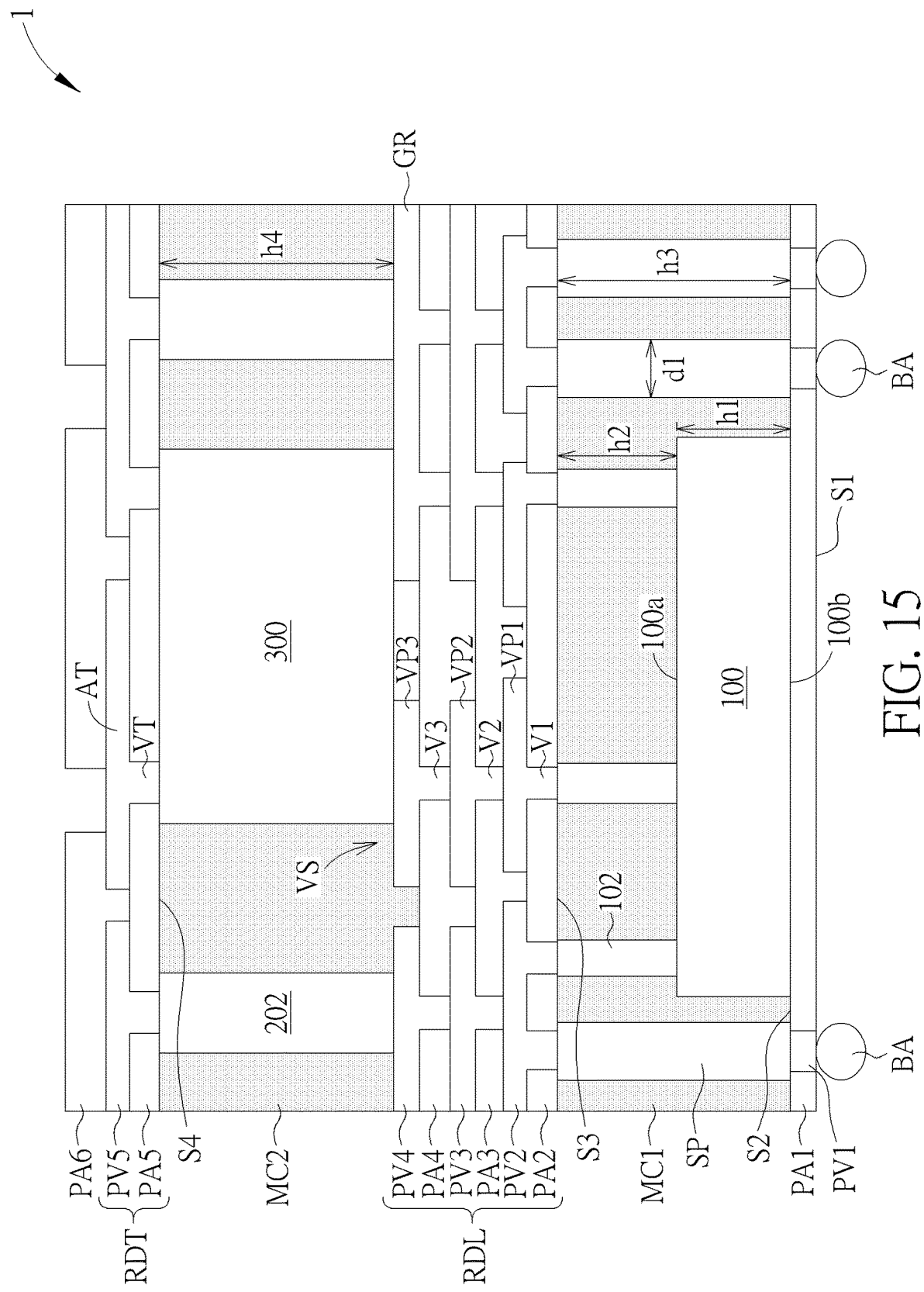
FIG. 15 is a schematic, cross-sectional diagram showing an exemplary semiconductor package with integrated antenna and shielding pillars in accordance with another embodiment of the invention.

FIG. 15 is a schematic, cross-sectional diagram showing an exemplary semiconductor package with integrated antenna and shielding pillars in accordance with another embodiment of the invention, wherein like regions, layers or elements are designated by like numeral numbers or labels. As shown in FIG. 15, a die 300 is disposed on the re-distribution structure RDL and surrounded by the molding compound MC2. According to some embodiments, the die 300 may be a dummy die, a bridge die, a TSV silicon die, or a flip-chip, but is not limited thereto.

Figure 16:
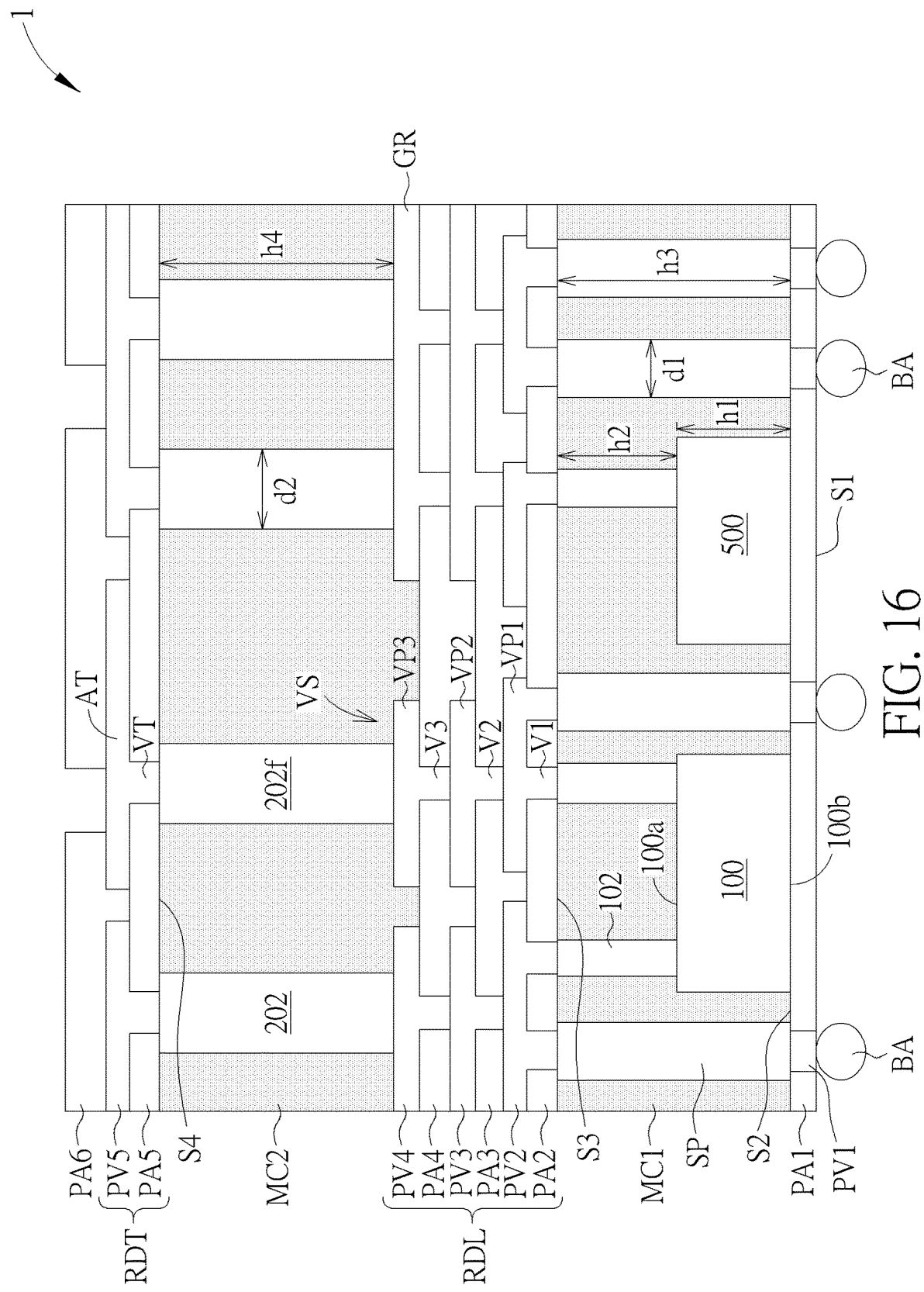
FIG. 16 is a schematic, cross-sectional diagram showing an exemplary semiconductor package with integrated antenna and shielding pillars in accordance with still another embodiment of the invention.

FIG. 16 is a schematic, cross-sectional diagram showing an exemplary semiconductor package with integrated antenna and shielding pillars in accordance with another embodiment of the invention, wherein like regions, layers or elements are designated by like numeral numbers or labels. As shown in FIG. 16, a die 500 is disposed on the base film PA1 and surrounded by the molding compound MC1. The die 500 is coplanar with the semiconductor die 100. According to some embodiments, for example, the die 500 may be a logic die, but is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a base film having a major surface and a bottom surface opposite to the major surface;
   a semiconductor die disposed on the major surface of the base film, wherein a plurality of interconnect elements is disposed in the base film and around the semiconductor die;
   a plurality of metal studs disposed on an active surface of the semiconductor die;
   a plurality of shielding pillars disposed on the interconnect elements of the base film, respectively;
   a first molding compound encapsulating the semiconductor die, the metal studs, and the shielding pillars on the base film;
   a first re-distribution structure disposed on a top surface of the first molding compound and is electrically connected to the shielding pillars and the metal studs, wherein the first re-distribution structure comprises a via stack electrically connected to and aligned with a corresponding one of the plurality of metal studs;
   a second molding compound disposed on the first re-distribution structure;
   a plurality of through-mold-vias disposed in the second molding compound, wherein the plurality of through-mold-vias comprises an antenna feed line disposed directly on the via stack;
   a second re-distribution structure disposed on the second molding compound and electrically connected to the through-mold-vias, wherein the second re-distribution structure comprises an antenna that is electrically connected to the semiconductor die through the antenna feed line, the via stack, and the corresponding one of the plurality of metal studs; and a plurality of connection elements disposed on the interconnect elements, respectively, on the bottom surface of the base film.

2. The semiconductor package according to claim 1, wherein the base film is a curable polymeric material film.

3. The semiconductor package according to claim 2, wherein the base film has a thickness of about 5-7 micrometers after curing.

4. The semiconductor package according to claim 1, wherein each of the plurality of interconnect elements is exposed from the bottom surface of the base film.

5. The semiconductor package according to claim 1, wherein the plurality of interconnect elements comprises solder balls.

6. The semiconductor package according to claim 1, wherein the semiconductor die comprises a RFIC die, a baseband chip, or a 5G wireless chip.

7. The semiconductor package according to claim 1, wherein a rear surface of the semiconductor die is adhered to the base film.

8. The semiconductor package according to claim 1, wherein the semiconductor die has a first height of about 40-60 micrometers above the major surface of the base film.

9. The semiconductor package according to claim 8, wherein the plurality of metal studs has a second height of about 40-60 micrometers.

10. The semiconductor package according to claim 9, wherein the plurality of shielding pillars has a third height of about 80-120 micrometers above the major surface of the base film.

11. The semiconductor package according to claim 10, wherein the third height is approximately equal to combination of the first height and the second height.

12. The semiconductor package according to claim 1, wherein each of the plurality of shielding pillars has a diameter of about 80 micrometers.

13. The semiconductor package according to claim 1, wherein top surfaces of the plurality of metal studs and the plurality of shielding pillars are coplanar with the top surface of the first molding compound.

14. The semiconductor package according to claim 1, wherein the first re-distribution structure comprises a plurality of dielectric films and a plurality of interconnect structures in or on the plurality of dielectric films.

15. The semiconductor package according to claim 14, wherein the plurality of dielectric films comprises curable polymeric material films, and wherein the plurality of interconnect structures comprises conductive traces or conductive vias.

16. The semiconductor package according to claim 14, wherein the plurality of interconnect structures further comprises a ground reflector.

17. The semiconductor package according to claim 14, wherein each of the plurality of dielectric films has a thickness of about 5-7 micrometers after curing.

18. The semiconductor package according to claim 1, wherein the via stack comprises a first via, a second via stacked on the first via, and a third via stacked on the second via, which are all substantially aligned with the corresponding one of the plurality of metal studs.

19. The semiconductor package according to claim 12, wherein each of the through-mold-vias has a diameter greater than the diameter of each of the plurality of shielding pillars.

20. The semiconductor package according to claim 1, wherein each of the through-mold-vias has a diameter of about 90 micrometers and a height of about 150-200 micrometers.

21. A semiconductor package, comprising:
a base film;
a semiconductor die disposed on the base film;
a plurality of metal studs disposed on an active surface of the semiconductor die;
a plurality of shielding pillars disposed on the base film;
a first molding compound encapsulating the semiconductor die, the metal studs, and the shielding pillars on the base film;
a first re-distribution structure disposed on the first molding compound, wherein the first re-distribution structure comprises a via stack electrically connected to and aligned with a corresponding one of the plurality of metal studs;
a second molding compound disposed on the first re-distribution structure;
a plurality of through-mold-vias disposed in the second molding compound, wherein the plurality of through-mold-vias comprises an antenna feed line disposed directly on the via stack; and
a second re-distribution structure disposed on the second molding compound and electrically connected to the through-mold-vias.

22. The semiconductor package according to claim 21, wherein the base film is a curable polymeric material film.

23. The semiconductor package according to claim 22, wherein the base film has a thickness of about 5-7 micrometers after curing.

24. The semiconductor package according to claim 21, wherein a plurality of interconnect elements is disposed in the base film and around the semiconductor die.

25. The semiconductor package according to claim 24, wherein a plurality of connection elements disposed on the interconnect elements, respectively, on a bottom surface of the base film.

26. The semiconductor package according to claim 24, wherein the plurality of shielding pillars is disposed on the interconnect elements of the base film, respectively.

27. The semiconductor package according to claim 21, wherein the first re-distribution structure is electrically connected to the shielding pillars and the metal studs.

28. The semiconductor package according to claim 21, wherein the second re-distribution structure comprises an antenna that is electrically connected to the semiconductor die through the antenna feed line, the via stack, and the corresponding one of the plurality of metal studs.

29. The semiconductor package according to claim 21, wherein each of the through-mold-vias has a diameter greater than the diameter of each of the plurality of shielding pillars.

30. The semiconductor package according to claim 29, wherein each of the through-mold-vias has a diameter of about 90 micrometers and a height of about 150-200 micrometers.

31. The semiconductor package according to claim 21, wherein a die is disposed in the second molding compound and on the first re-distribution structure.

32. The semiconductor package according to claim 31, wherein the die comprises a dummy die, a bridge die, a TSV silicon die, or a flip-chip.

33. The semiconductor package according to claim 21, wherein a die is disposed on the base film and is coplanar with the semiconductor die.

34. The semiconductor package according to claim 33, wherein the die comprises a logic die.

* * * * *